US008803670B2

(12) United States Patent
Steckel et al.

(10) Patent No.: US 8,803,670 B2
(45) Date of Patent: Aug. 12, 2014

(54) OPERATING CONTROL HAVING SPECIFIC FEEDBACK

(75) Inventors: Michael Steckel, Vilsbiburg (DE); Karsten Ruter, Landshut (DE); Raimund Kreis, Vilsbiburg (DE)

(73) Assignee: Lisa Dräxlmaier GmbH, Vilsbiburg (DE)

( * ) Notice: Subject to any disclaimer, the term of this patent is extended or adjusted under 35 U.S.C. 154(b) by 1303 days.

(21) Appl. No.: 12/552,300

(22) Filed: Sep. 2, 2009

(65) Prior Publication Data

US 2010/0060437 A1    Mar. 11, 2010

(30) Foreign Application Priority Data

Sep. 5, 2008  (DE) .......................... 10 2008 046 102

(51) Int. Cl.
*G08B 6/00*      (2006.01)
(52) U.S. Cl.
USPC ....................................... 340/407.2; 701/300
(58) Field of Classification Search
USPC ........... 340/407.2, 611, 626, 679; 701/300, 2; 345/177, 184, 156; 137/68.23
See application file for complete search history.

(56) References Cited

U.S. PATENT DOCUMENTS 6,347,149 B1 *  2/2002  Bachmann et al. ........... 381/396
6,382,567 B2 *  5/2002  Franke .......................... 246/476
2003/0038776 A1 *  2/2003  Rosenberg et al. ........... 345/156
2004/0008191 A1 *  1/2004  Poupyrev et al. ............. 345/184
2005/0133347 A1    6/2005  Hein et al.
2006/0144680 A1    7/2006  Pelletier et al.
2007/0244641 A1 * 10/2007  Altan et al. ................... 701/300
2008/0231612 A1 *  9/2008  Hill et al. ...................... 345/177
2008/0297475 A1 * 12/2008  Woolf et al. .................. 345/163

FOREIGN PATENT DOCUMENTS

| DE | 101 03 563 A1 | 8/2002 |
| DE | 101 26 670 A1 | 12/2002 |
| DE | 103 26 400 A1 | 12/2004 |
| DE | 10 2004 052 241 A1 | 7/2005 |
| DE | 10 2004 029 718 A1 | 1/2006 |
| DE | 10 2006 021 593 A1 | 11/2007 |
| EP | 1 358 626 B1 | 1/2002 |
| WO | WO 2004/081776 A1 | 9/2004 |

* cited by examiner

*Primary Examiner* — Shirley Lu
(74) *Attorney, Agent, or Firm* — Wolf, Greenfield & Sacks, P.C.

(57) ABSTRACT

An operating control, in particular in a motor vehicle, wherein the operating control has at least one actuating element for actuating the operating control. The operating control comprises at least one sensor element operatively connected to the actuating element for registering an actuation, and at least one oscillator coil fixedly connected to the actuating element for emitting a mechanical feedback signal, in particular bending waves, through the actuating element. The feedback signal is haptically and/or acoustically perceivable, preferably simultaneously haptically and acoustically perceivable. The operating control includes a controller element for activating the oscillator coil in case of actuation of the operating control.

21 Claims, 2 Drawing Sheets

OPERATING CONTROL HAVING SPECIFIC FEEDBACK

TECHNICAL FIELD

The invention concerns an operating control, in particular in a motor vehicle, which comprises at least an actuating element for actuating the operating control and at least a sensor element operatively connected with the actuating element for registering an actuation. Further, the invention concerns a component of a vehicle interior having such an operating control as well as a method for outputting feedback of an operating control.

PRIOR ART

In particular in operating controls having actuating elements that are not mechanically moved upon actuation, it is often difficult for an operator to recognize if the operating control has realized and implemented the desired actuation. In operating controls such as press switches or push buttons, the operator can easily understand if the switch or push button has been operated correctly. This happens for example by locking in of a switch or by exceeding a mechanical pressure point so that the operator is immediately given a haptically or also acoustically perceivable feedback regarding the actuation of the actuating element.

Actuating elements without mechanical displacement such as touch sensors or touch screens do not have such an inherent feedback mechanism. In particular in touch screens, the feedback also occurs in a purely optical or acoustical manner.

Especially when using an operating control in a motor vehicle it is important, however, that an operator receives feedback regarding the performed actuation even without looking at the actuating element. For this purpose, acoustic and/or haptic feedbacks are suitable, which do not require an optical perception by the driver.

In document DE 10 2004 052 241 A1 a sound generator and a haptic converter for outputting an audible and/or palpable (feelable) switch feedback are described. The haptic converter is present in the form of an electromagnet (solenoid) inducing a piston to round, knock or vibrate against a switch block. For an audible switch feedback, in contrast, the sound generator is utilized.

However, the device disclosed in that document has the disadvantage, that two separate elements, that is the sound generator and the haptic converter, need to be used. This results in a complicated structure of a device outputting the desired feedback signal.

In a further document, DE 101 26 670 A1, a method for generating a response signal is described. Here, a piezoelectric element is employed for generating an amplified periodic signal. Due to the small displacement realizable by piezoelements it is necessary, however, that the piezoelement resonantly excites an overall system. Thus, the piezoelement is only suitable for a haptically perceivable output of discrete resonance frequencies of the overall system to which the piezoelectric element is connected. This limits the type and the frequency bandwidth of the feedback that can be output by this method.

SUMMARY OF THE INVENTION

It is thus an object of the present invention to devise an operating control pertaining to the above-mentioned technical field, which provides a haptically and/or acoustically well perceivable and freely selectable feedback signal for indicating the actuation of an operating control while limiting as far as possible the constructional effort.

This object is achieved by the features of claim 1. According to the invention, the operating control comprises at least an actuating element for actuating the operating control, at least a sensor element operatively connected with the actuating element for registering an actuation, at least an oscillator coil fixedly connected to the actuating element for emitting a mechanical feedback signal, and a controller element for specifically activating the oscillator coil upon actuation for the operating control (control device). The feedback signal is haptically and/or acoustically perceivable, preferably both haptically and acoustically perceivable at the same time. In particular, the oscillator coil emits (that is the actuating element acting as a membrane is made to oscillate). For example, this has the advantage of a particularly compact construction since the actuating element serves not only for actuating, but at the same time also for outputting the feedback signal, and thus a further output elements such as a separate loudspeaker, become unnecessary. Moreover, the use of the actuating element for outputting the feedback signal is particularly well-suited for transmitting the feedback signal to the operator (user) as usually a contact between the operator and the operating control is established for operating the operating control and a haptically perceivable signal can be returned immediately.

The actuating element of the invention may react upon touch or pressure. The contact of a finger of the operator, for example, with the actuating element may be sufficient for this purpose. Preferably, the actuating element may be a decorative part or a form part made of metal, wood or plastic and may be situated in the interior of a motor vehicle. The sensor element may preferably be attached to the actuating element. However, it is also possible that the sensor element measures motion remotely, for instance by means of a laser, or reacts to pressure differences or strains of the actuating element, for example of a decorative part. Possible sensor elements may in particular be a piezo sensor, a capacitive sensor, a force sensing resistor or another pressure or proximity sensor, for example.

The oscillator coil is for instance a so-called "exciter" operating by means of the plunger coil principle. By means of the oscillator coil to which an electric voltage or an electric current is applied, it is possible to convert the oscillations of the applied voltage or the applied current into mechanical oscillations. The form of the applied electrical signals, for example a sine wave, a square wave, a sawtooth wave or any superposition of different periodic or non-periodic signals is irrelevant for the output of the oscillator coil configured as an exciter. The intensity of the mechanical oscillations may also be controlled as a function of the intensity of the electrical signals. In place of the preferred bending waves by which the entire actuating element, that is for example a decorative or form part of the vehicle interior, is made to oscillate, it is also possible to transmit pure surface waves onto the actuating element.

In addition, for example by disposing a plurality of oscillator coils, also a strongly localized feedback may be achieved in a mechanical way, by creating localized cancellations of the feedback signal, for example. As the oscillator coil utilizes the actuating element itself in order to output the mechanical feedback signal, an operator may directly realize if the actuating element has been actuated correctly.

A processor having a memory element may be used as controller element, for example. In the memory element, different feedback signals can be stored, which are selected by the processor of the controller element and are emitted through the oscillator coil. The controller element is suitable for specifically activating the oscillator coil in case of an actuation of the operating control such that an operator may infer the actuation of the actuating element, in particular the actuation of a specific actuating element or the triggering of a specific function, by means of the emitted feedback signal. It may for example be envisioned that the frequency and the intensity of the signal can correlate with the duration of actuation of the actuating element corresponding to a push button "being kept pressed". In addition, due to the particularly large spectrum of emittable feedback signals almost arbitrary combinations of single periodic or non-periodic signals may be selected by the controller element and emitted through the oscillator coil.

Advantageously, the oscillator coil is connected with the actuating element and a fixing element (mounting element). In this preferred embodiment, the oscillator coil is, thus, a connecting element between the actuating element and the mounting element. In this way, a relative motion between the actuating element and the mounting element may easily be recognized by means of the oscillator coil.

The oscillator coil may alternatively be floatingly mounted to the actuating element, for example. However, in the case of a floating fixation of the oscillator coil to the actuating element it is of advantage that the oscillator coil has a properly dimensioned mass element which due to its mass inertia is adapted to support the oscillator coil against the actuating element at high frequencies and to let corresponding signals be transmitted to the actuating element. The choice of the mass of the mass element depends upon the type of actuating element. In particular, the mass of the actuating element as well as its elasticity are of special relevance for the choice of the mass of the mass element.

It is further preferred that a force applied to the actuating element and/or a distance travelled by the actuating element with respect to the mounting element is detectable by the oscillator coil, in particular by generating an electrical voltage through the oscillator coil. In an embodiment of the operating control, in which the oscillator coil is fixedly connected both with the actuating element and with the mounting element, it is particularly well possible that the oscillator coil, which in its active operating mode converts an electrical signal into a mechanical motion, in its passive operating mode generates an electrical signal from a mechanical motion. Thus, it is possible to use the oscillating coil as additional sensor element of the operating control, too.

An electrical signal generatable by changing the fraction of the coil penetrated by the magnetic field may preferably be utilized in dynamic processes, for example during the pressing of the actuating element, for determining a condition (state).

An actuation that is characterized by a force continuously applied to the actuating element would also be detectable by the described construction since a variation of the signal around a "zero position" inherently results due to outer influences and the associated superposition with dynamic events. In the case of a force continuously applied by the operator, for example, the time profile of the signal may allow to infer the condition of the operator (for example the physical condition of the driver such as the level of alcoholization or fatigue) or alternatively of the vehicle (for example the condition of the vehicle's suspension) or of the vehicle environment (for example the road condition). In predetermined conditions, information of a vehicle occupant may be effected by means of an acoustic or haptic feedback.

It is also possible, for example, to output a signal that the actuating element has been actuated, to the controller element through the sensor element, whereafter the oscillator coil may register the actuation force or the actuation distance (travel), for example, and transmit a corresponding signal to the controller element. The oscillator coil may, thus, also act as a control entity for the sensor element.

Advantageously, the oscillator coil is configured to emit a mechanical frequency signal in a frequency range of between 15 Hz and 20 kHz. The frequency corresponds the effective period of the signal, wherein this signal may also come about by the superposition of several waves, in particular of significantly higher and significantly lower frequencies, for example. The oscillator coil is, thus, generically suited to generate signals of a significantly broader frequency range; however, it has turned out to be particularly advantageous to emit as feedback signals such periodic signals that are generated possibly by a superposition of a plurality of periodic signals and have a frequency of between 15 Hz and 10 kHz. The lower limit of 15 Hz comes about due to the properties of the feedback signal to be particularly well palpable (tactile), the upper limit of 10 kHz due to the property to be particularly well audible.

In a preferred embodiment, the operating control further comprises a memory element for storing frequency signals, wherein the oscillator coil is activatable by the controller element for specifically emitting one or more of the stored frequency signals, in particular those generated by a superposition of at least two substantially sinusoidal frequency signals. The mentioned memory element may be provided both as a separate element and within the controller element.

By means of the above-described superposition of at least two substantially sinusoidal frequency signals, signals different from sinusoidal frequency signals may be output by the oscillating coil, too. Examples thereof are the already mentioned square or sawtooth signals as well as a combination of a haptically perceivable signal and an acoustically perceivable signal that is a superposition of a low frequency and a high frequency sinusoidal feedback signal. These superpositions of periodic signals can be retrieved particularly fast in a form stored in the memory element.

In the memory element, an association of a particular event, for example the actuation of a specified actuating element or the actuation of the actuation element over a specified period of time, with a feedback signal to be correspondingly emitted may be stored. Moreover, it is also possible that this association is performed solely by the controller element which selects one or more frequency signals stored in the memory element and to be emitted through the oscillating coil for emitting a feedback signal.

It is particularly preferred that the memory element is configured for storing arbitrary, preferably periodic, approximated signals, most preferably signals approximated by a Fourier series. In this way, even a complicated compound signal may quickly be retrieved and does not have to be recalculated by the controller element first. In this case, the calculation means the selection of the frequencies to be superimposed together with their respective amplitudes.

In a further preferred embodiment, the operating control comprises at least two sensor elements, wherein the oscillating coil is specifically activatable, in particular by emitting a specific signal by the controller element depending on the sensor element registering the actuation. The two mentioned sensor elements are situated in two different locations on the actuating element so that, by the cooperation of the two sensor elements, that is the concerted registering of an actuation, the location on the actuating element may be deduced at which the operator has performed the actuation.

A corresponding arrangement of sensor elements may, for example, be used for a sensory control of a key pad which may be formed by a single actuating element and by several allotments present on the actuating element. Preferably, each allotment is associated with a sensor element. In the case of an actuating element having a plurality of allotments, for example a numeric pad (numeric key pad), a separate sensor element or a separate region on a common sensor element may preferably be provided for each allotment of the numeric pad. Depending on in which allotment that is by which sensor element, the operation of the actuating element has been registered, a corresponding signal to be emitted through the oscillator coil is selected by the sensor element. The emitted signal is, thus, specifically dependent upon the location on the actuating element at which the operator has performed the actuation. Moreover, as mentioned above, further parameters are conceivable which may lead to the emission of a corresponding specific signal.

According to the invention, a component of a vehicle interior having a control element according to the invention is configured such that the compartment-side surface of the component facing the vehicle interior comprises the at least one actuating element. Examples for such a component of a vehicle interior are an ornamental or decorative trim, a steering wheel, a gear stick knob, a ventilation outlet, a window lifter or similar components. The surface of the component facing the vehicle interior is understood to mean that surface of the component adjoining the vehicle interior and directly accessible therefrom. Thus, it is possible, for example, to provide functional surfaces on the mentioned components, through which an operator may perform the control of a vehicle function by means of the actuating element and the remaining mentioned elements of the operating control.

A method for outputting a feedback of an operating control according to the invention is triggered by the at least one sensor element registering a contact of at least one actuating element by the operator. Depending upon the registered contact, a controller element activates an oscillator coil such that the oscillator coil outputs a specific mechanical feedback signal, in particular a bending wave, through the actuating element. The feedback signal is haptically and/or acoustically, preferably simultaneously haptically and acoustically perceivable.

The specific mechanical feedback signal may be specific insofar as it may for example be hard or soft, loud or subdued, strong or weak, locally specific, time specific, for example as a sequence of signals encoding an information, or may otherwise be dependent on the registered contact. The specification of the mechanical feedback signal allows the operator to infer signal the actuated actuating element and, thus, the performed control operation from the feedback.

Preferably the controller element activates the oscillator coil for emitting a frequency signal, wherein the frequency signal may be directly stored in a memory element or may be formed by the controller element by superimposing at least two substantially sinusoidal frequency signals, in particular frequency signals stored in the memory element. The memory element may also be integrated within the controller element, as described above, or may be provided as a separate element.

It is further preferred that the controller element activates the oscillator coil upon registering a contact through a first sensor element for emitting a first feedback signal, and upon registering a contact through a second sensor element for emitting a second feedback signal, wherein the first feedback signal is, in particular, different from the second feedback signal. In an operating control having two different sensor elements it may, as described above, be of importance which of the sensor elements registers the contact by the user since this allows to infer a certain location on the actuating element, which the user has touched. For example, a certain function may be associated with this location, as this is for example the case with a key pad of a numeric key pad. In this case it is particularly convenient for the user if the acoustic and/or haptic feedback by the controller element is chosen so that a distinction between the feedback signals of the single sensor elements is possible.

Advantageously the oscillator coil outputs electrical signals to the sensor element if the oscillator coil is fixedly connected with the actuating element and a mounting element. The electrical signals are generated as a function of a force applied to the actuating element and/or a distance (path) travelled by the actuating element with respect to the mounting element, and are outputted.

In this preferred method, the controller element further associates the electrical signals of the oscillator coil to an event and activates the oscillator coil for emitting a specific feedback signal depending upon the event. In associating the electrical signal of the oscillator coil with an event, the controller element needs, however, to distinguish between a motion of the oscillator coil due to the oscillator coil itself, that is an emitted feedback signal, and an outer influence distinct therefrom, that is the actuation of the actuating element. By combining the oscillator coil for recognizing events and the sensor element a multi-stage sensor or switch can be created, for example.

Examples of such a combination of oscillator coil and sensor element are a detection of the point of contact of the user on the actuating element by means of the sensor element and a detection of the contact pressure by the oscillator coil. In a further example, it is possible that a slight pressure or a key travel is detected by the sensor element, while a larger pressure or key travel is detected by the oscillator coil. In this way, it is possible to create a switch having several switching thresholds. Due to the circumstance that the voltage at the oscillator coil is changed by the pressure onto the actuating element, the oscillator coil as such may be used as sensor element if the voltage generated by the oscillator coil is evaluated as switching signal. Since the deformation/displacement of the oscillator coil and the force necessary for this may proportional to the voltage generated by the oscillator coil, it may hence be ascertained how far and with which force the actuating element has been touched. This may also be used to distinguish between an intended "switching" and a "propping" action. It might also be possible to utilize this detection in the case of a crash and trigger a desired function if an impact onto the actuating element is detected.

According to the invention, the described operating control is used for applying the method of the invention. The use of an oscillator coil for emitting the mechanical feedback signal makes it possible to apply almost arbitrary signal shapes and large signal amplitudes or large signal forces in a wide frequency range to the actuating element. Thus, a simple structure is provided, which is suitable for emitting haptic and/or acoustic feedback signals, wherein the feedback signals are very well adaptable and, thus, specifically adjustable to the event to be indicated. The operating control according to the invention is thus eminently suitable for use in a motor vehicle in which a driver, whose eyes are directed to the events outside of the vehicle, may control different electronic components in the vehicle, such as communication systems like a car phone, driver assistance systems like a navigation system or an on-board computer, multimedia appliances such as a car stereo, comfort systems such as ventilation and air conditioning, or even vehicle operation systems such as gear shift, cruise control, windshield wipers or the like.

Further preferred embodiments will become apparent from the detailed description of the figures as well as from the claims as a whole.

PREFERRED EMBODIMENTS

Figure 1:
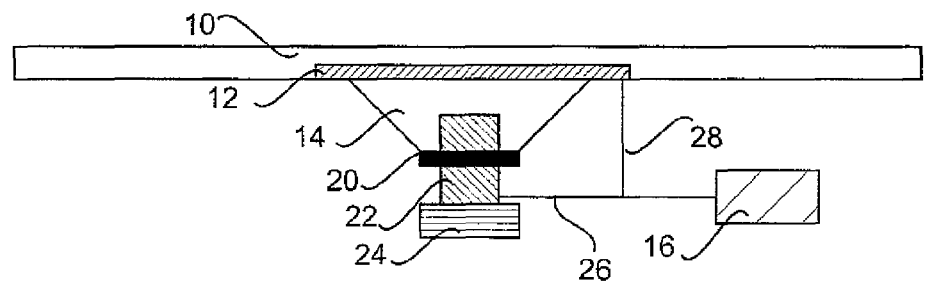
FIG. 1 shows an operating control according to a first preferred embodiment.

FIG. 1 shows a first preferred embodiment of an operating control. An actuating element 10 is provided with a sensor element 12 which is capable of registering contact (touch) with the actuating element 10. The actuating element 10 is configured as a contact element having a surface and may, for example, be a decorative part or a form part made of metal, wood or plastic or the like. The actuating element 10 is actuated by a user touching the surface of the actuating element 10, for example. Accordingly, the sensor element 12 is a pressure or proximity sensor, wherein this sensor may be formed by a piezo sensor, a force sensing resistor (FSR) or a capacitive sensor. The actuating element 10 which otherwise only provides a decorative function, thus constitutes at the same time a protective layer for the sensor element 12 against undue outer influences (impact) onto the sensor element 12. In the first embodiment of the operating control shown in FIG. 1, the actuating element 10 is formed by a wooden ornamental trim (strip) and the sensor element 12 is formed by a piezo sensor.

Further, an oscillator coil 14 is mounted to the actuating element 10. The oscillator coil 14 is connected to the actuating element 10, that is the wooden ornamental trim, via a basket. It further comprises a magnet member 22 and a coil member 20 through which an electric voltage or current pulse may flow and by which a correspondingly configured magnetic field may be generated. Further, in the embodiment of the actuating element shown in FIG. 1, a mass element 24 is attached to the magnet member 22 interacting with the magnetic field generated by the coil member 20. The mass element 24 at the magnet member 22 serves to support the magnet member 22 against the inertia of the mass element 24 during high frequency vibrations of the oscillator coil 14. With corresponding electrical signals in the coil member 20, the oscillator coil 14 excites bending waves of the actuating element through the proportional displacement (excursion) and force application of the oscillator coil 14 onto the actuating element 10. Thus, the actuating element 10 itself is made to oscillate so that a user touching the actuating element 10 will directly haptically perceive the bending waves of the actuating element 10. In addition to a haptic perception of the bending waves of the actuating element 10, it is moreover possible that the user will perceive these bending waves of the actuating element 10 acoustically if the frequencies emitted by the oscillator coil 14 are chosen correspondingly high.

The oscillator coil 14 and the sensor element 12 are connected, by means of electrical leads 26, 28, to a controller element 16 which causes the oscillator coil 14 to emit a feedback signal based upon an event sensed by the sensor element 12. To that end, a correspondingly shaped electrical voltage or current signal is outputted through the controller element 16 to the coil member 20 of the oscillator coil 14, thereby causing the magnet member 22 having the mass element 24 attached thereto to perform correspondingly shaped oscillations which are directly transmitted to the actuating element by virtue of the mounting of the oscillator coil 14 to the actuating element 10, and which also makes the latter perform oscillations which are haptically and/or acoustically perceivable by a user.

According to the event detected by the sensor element 12, the controller element 16 may decide which form, intensity, duration or time profile will be exhibited by the feedback signal emitted by the oscillator coil 14. Thus, for a long-lasting actuation of the actuating element 10 by a user, a long-lasting feedback signal may be outputted by the oscillator coil 14, for example.

Figure 2:
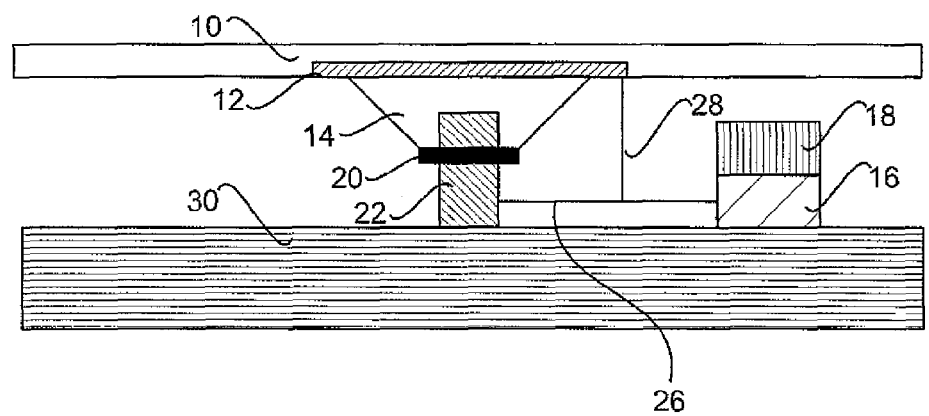
FIG. 2 shows the operating control according to a second preferred embodiment.

FIG. 2 shows a second embodiment of an operating control which differs from the operating control of the embodiment shown in FIG. 1 in that in place of the mass element 24 shown in FIG. 1 a mounting element 30 is provided in the embodiment shown in FIG. 2. The mounting element 30 is fixed at least with respect to the actuating element 10 so that a force between the mounting element 30 and the actuating element 10 is applied through the oscillator coil 14, in particular the coil member 20 and the magnet member 22. In particular, also at low frequencies of the feedback signal, the force applied by the oscillator coil 14 onto the actuating element 10 causes a larger deformation of the actuating element 10 than possible in the case of the embodiment having the mass element 24 and shown in FIG. 1. Moreover, due to the circumstance that the oscillator coil 14 may rest against the mounting element 30, higher forces may be transmitted onto the actuating element 10, too.

Further, in the embodiment of the operating control shown in FIG. 2, a memory element 18 is additionally provided at the controller element 16. The memory element 18 serves for storing different feedback signals which are transmitted through the oscillator coil 14 onto the actuating element 10 after activation by the controller element 16. The memory element 18 is, of course, also suitable for storing other data, such as criteria for certain events recorded by the sensor element 12, algorithms for the configuration of electrical feedback signals, or just to store directly corresponding feedback signals and providing them to the controller element 16 for retrieval.

Moreover, in the preferred embodiment of the operating control shown in FIG. 2, a further functionality of the oscillating coil 14 is conceivable. As the magnet member 22 rests against the mounting element 30, an actuation of the actuating element 10 associated with an application of force onto the actuating element 10 and directed towards the mounting element 30 will lead to a relative displacement between the coil member 20 and the magnet element 22. Due to the induction in the coil member 20 associated with such a displacement, an electrical signal is created based upon the actuation of the actuating element 10, which signal may flow to the controller element 16 via electrical lead 26. The controller element 16 may, thus, resort to a further sensor for detecting an actuation of the actuating element 10 by inverting, so to say, the function of the oscillator coil 14 for outputting a mechanical signal.

The combination of the sensor element 12 and the oscillator coil 14 acting as a sensor thus leads to an enlarged spectrum of function of the operating control. For example, the sensor element 12 may detect where on the actuation element 10 an actuation on the part of a user has taken place, whereas the oscillator coil 14 may determine how large is the pressure onto the actuating element 10 or by which distance of travel the actuating element 10 has been displaced in direction of the mounting element 30. A possible application for the combined detection of an actuation of the actuating element 10 is a switch having two or more switching thresholds, wherein the sensor element 12 detects a slight pressure or distance of travel, whereas a larger pressure or distance of travel is detectable by the oscillator coil 14 and a correspondingly configured electrical pulse to the controller element 16.

Figure 3:
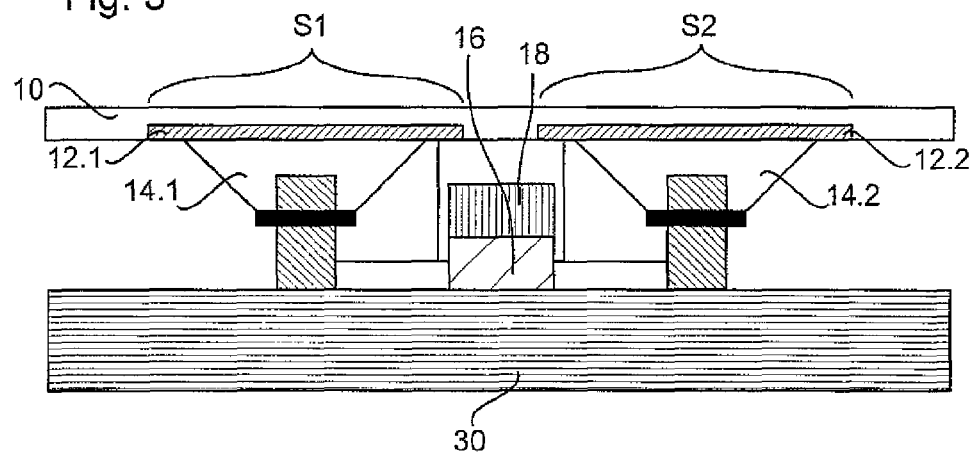
FIG. 3 shows the operating control according to a third preferred embodiment.

FIG. 3 shows a further preferred embodiment of the operating control, wherein the actuating element 10 is provided with two sensor elements 12.1, 12.2 and two oscillator coils 14.1, 14.2, wherein the individual sensor elements 12.1, 12.2 correspond to the sensor element 12 in FIGS. 1 and 2, and the oscillating coils 14.1 and 14.2 are substantially the same oscillator coils 14 in FIGS. 1 and 2. Accordingly, these components are not described in further detail. In analogy to the embodiment of the operating control shown in FIG. 2, the oscillator coils 14.1, 14.2 rest against a mounting element 30 so that an enlarged functionality of the oscillator coils 14.1, 14.2 as their own sensor elements, is possible also here.

Due to the provision of two sensor elements 12.1, 12.2, two sensor surfaces S1, S2 are created on the actuating element 10, on which an actuation by an operator may very accurately be detected. Thus, by providing a plurality of sensor elements 12 in an actuating element 10, it is possible to provide, for example, a numeric key pad or several adjacent keys in an actuating element 10, which may be configured as a wooden ornamental part, for example. The controller element 16, which is connected to both sensor elements 12.1, 12.2 as well as both oscillating coils 14.1, 14.2 in the embodiment shown in FIG. 3, is suitable for emitting electrical signals to the oscillating coils 14.1, 14.2 so that these oscillating coils 14.1, 14.2 return corresponding specific signals to the user via the actuating element 10. The signal may most preferably depend upon which sensor region S1, S2 has been actuated by the user, in particular in the case that a certain function is associated to each sensor region S1, S2, which function is performed by the sensor element 12 via the controller element 16 and a corresponding, for instance electronic aggregate in the vehicle.

Alternatively, it is also conceivable that a plurality of sensor elements 12.1, 12.2 is provided at the actuating element 10, with the feedback signals only being outputted through one oscillating coil 14, however. Here, the oscillator coil 14 is adapted to output such different signals that a distinction between the selected sensor elements is possible by a single oscillator coil 14, too.

In all three preferred embodiments of the operating control, a periodic signal in a frequency range between 14 Hz and 20 kHz is emitted through the oscillator coils 14, 14.1, 14.2. In the frequency range between these limit frequencies, the signals emitted through the oscillator coils 14, 14.1, 14.2 are particularly well palpable and audible. Here, the outputted signals may be created in particular by a superposition of periodic signals of greatly different frequencies that may also lie outside of the above-mentioned frequency range. Apart from the equally possible non-periodic feedback signals that are also possible and that are outputted by the oscillating coils 14, 14.1, 14.2, via the actuating element 10 to the user preferably periodic, approximated signals are emitted by the oscillating coils 14, 14.1, 14.2. It is particularly preferred that corresponding periodic signals are approximated by a Fourier series, that is created by a weighted superposition of sinusoidal oscillations of different frequencies and phase shifts.

Figure 4:
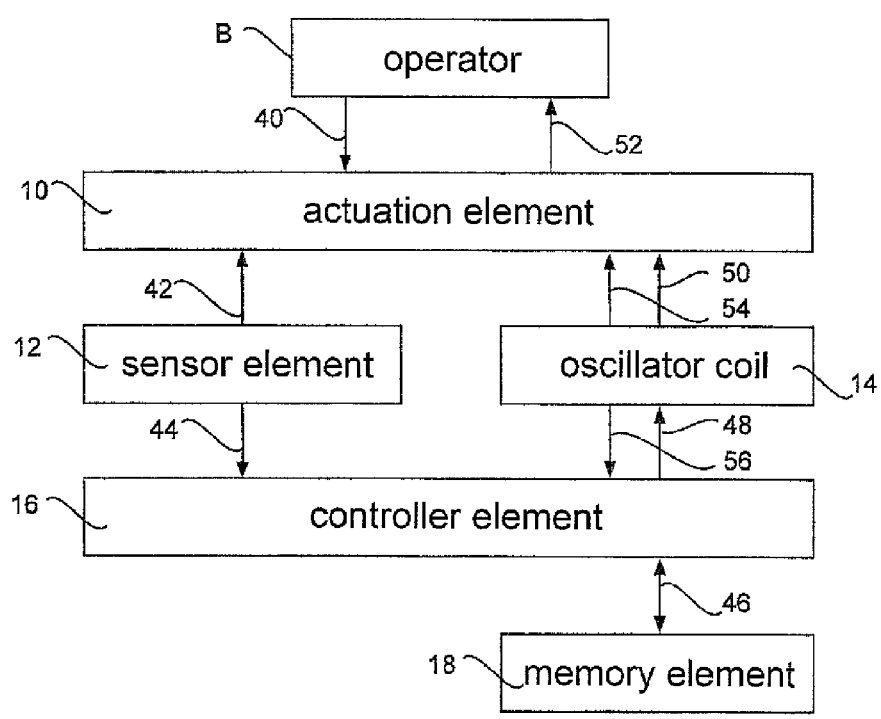
FIG. 4 shows a flow diagram of a preferred method for outputting a feedback of an operating control.

Finally, FIG. 4 shows a flow diagram for illustrating a method for outputting a feedback of an operating control. A user B initiates the method by performing an actuation 40 of the actuating element 10. In particular, this is effected by touching (contacting) a surface of a wooden ornamental part in the interior of a vehicle.

A sensor element 12 situated in, above or below the actuating element 10 monitors the actuating element 10 for an actuation 40 on the part of a user B. Upon registration 42 of an actuation of the actuating element 10, a transmission 44 of the registered event from the sensor element 12 to a controller element 16 is effected. Subsequently, the controller element 16 causes an activation 48 of an oscillator coil 14 for the specific emission 50 of a signal via the actuating element 10 for forming a feedback signal 52 toward the user B. Here, it is particularly preferred that the controller element 16 operates in a particularly efficient manner by retrieval 46 of a frequency signal from a memory element 18.

In a preferred embodiment of the operating control, the oscillator coil 14 is, moreover, adapted to monitor the actuating element 10 for an actuation by a user B, too. In this case, a registration 54 of an actuation of the actuating element 10 by the oscillator coil 14 will lead to the transmission 56 of a signal to the controller element 16. In this case, the controller element 16 elaborates both a signal outputted from the sensor element 12 and from the oscillator coil 14 regarding an actuation of the actuating element 10. Here, it is to be observed that the controller element 16 needs to distinguish the active emission 50 of signals through the oscillator coil 14, which may be traced back to the activation 48 of the oscillator coil 14 by the controller element 16, and an external actuation of the actuating element.

The invention claimed is:

1. An operating control for use in a motor vehicle, comprising:
    at least one actuating element for actuating the operating control,
    at least one sensor element operatively connected with the actuating element for registering an actuation of the operating control,
    at least one oscillator coil fixedly connected to the actuating element, the at least one oscillator coil emitting a mechanical feedback signal through the actuating element; and
    a controller element for specifically activating the oscillator coil in the case of an actuation of the operating control,
    wherein the oscillator coil is fixedly connected with the actuating element and a mounting element and
    wherein a force applied to the actuating element or a distance travelled by the actuating element with respect to the mounting element is detectable by the oscillator coil by generating an electrical voltage.

2. The operating control according to claim 1, the oscillator coil is configured to emit a mechanical frequency signal in a frequency range between 15 Hz and 20 kHz.

3. The operating control according to claim 1, further comprising a memory element for storing frequency signals, wherein the oscillator coil is activatable by the controller element for specifically emitting one or more stored frequency signals.

4. The operating control according to claim 3, wherein the memory element is configured for storing arbitrary signals.

5. The operating control according to claim 1, further comprising at least two sensor elements, wherein the oscillator coil is specifically activatable by the controller element emitting a specific signal as a function of at least one of the at least two sensor elements registering an activation.

6. The operating control according to claim 1, in combination with a component of a vehicle interior, wherein the at least one actuating element comprises a surface of the component facing the interior.

7. A method for outputting a feedback of an actuation of an operating control for use in a motor vehicle, the method comprising:
registering a contact of at least one actuating element by a user through at least one sensor element,
wherein a controller element, in response to the at least one sensor element registering contact of the at least one actuating element by the user, activates an oscillator coil to output a mechanical feedback signal through the actuating element,
and wherein the oscillator coil is fixedly connected to the actuating element and a mounting element, characterized in that the oscillator coil outputs electric signals to the controller element, wherein the electric signals are generated as a function of a force applied to the actuating element or a distance travelled by the actuating element with respect to the mounting element, and are outputted.

8. A method according to claim 7, wherein the controller element activates the oscillator coil for emission of a frequency signal, wherein the frequency signal may be directly stored in a memory element or may be formed by the controller element by a superposition of at least two sinusoidal frequency signals, stored in the memory element.

9. The method according to claim 7, wherein the controller element activates the oscillator coil upon registration of a contact by a first sensor element configured to emit a first feedback signal and upon registration of a contact by a second sensor element configured to emit a second feedback signal, wherein the first feedback signal is different from the second feedback signal.

10. The method according to claim 7, wherein controller element associates the electrical signals of the oscillator coil to an event and activates the oscillator coil for emission of a specific feedback signal depending upon the event.

11. The method according to claim 7, wherein the mechanical feedback signal comprises bending waves.

12. The method according to claim 7, wherein the mechanical feedback signal is haptically or acoustically perceivable.

13. The method according to claim 7, wherein the mechanical feedback signal is simultaneously haptically and acoustically perceivable.

14. The method according to claim 7, wherein the oscillator coil is fixedly connected to the actuating element and a mounting element, characterized in that the oscillator coil outputs electric signals to the controller element, wherein the electric signals are generated as a function of a force applied to the actuating element and a function of a distance travelled by the actuating element with respect to the mounting element, and are outputted.

15. The operating control according to claim 1, wherein the mechanical feedback signal comprises bending waves.

16. The operating control according to claim 1, wherein the mechanical feedback signal is haptically or acoustically perceivable.

17. The operating control according to claim 1, wherein the mechanical feedback signal is simultaneously haptically and acoustically perceivable.

18. The operating control according to claim 1, wherein a force applied to the actuating element and a distance travelled by the actuating element with respect to the mounting element are detectable by the oscillator coil by generating an electrical voltage.

19. The operating control according to claim 4, wherein the arbitrary signals comprise periodic approximated signals.

20. The operating control according to claim 4, wherein the arbitrary signals comprise signals approximated by a Fourier series.

21. The operating control according to claim 3, wherein the frequency signals are a superposition of at least two sinusoidal frequency signals.

\* \* \* \* \*